United States Patent [19]
Fucili

[11] Patent Number: 5,526,390
[45] Date of Patent: Jun. 11, 1996

[54] DECODED COUNTER WITH ERROR CHECK AND SELF-CORRECTION

[75] Inventor: Giona Fucili, Magenta, Italy

[73] Assignee: SGS-Thomson Microelectronics, S.R.L., Agrate Brianza, Italy

[21] Appl. No.: 260,189

[22] Filed: Jun. 15, 1994

[30] Foreign Application Priority Data

Jun. 21, 1993 [EP] European Pat. Off. .............. 93830264

[51] Int. Cl.$^6$ .......................... H03K 21/40; H03K 23/54
[52] U.S. Cl. ................. 377/29; 377/31; 377/46; 377/54; 377/80
[58] Field of Search .................. 377/29, 31, 46, 377/54, 80

[56] References Cited

U.S. PATENT DOCUMENTS 3,639,740  2/1972  Escoffier et al. .................... 340/146.1
5,373,542  12/1994  Sunouchi ............................. 377/46

OTHER PUBLICATIONS

Patent Abstracts of Japan, vol. 16, No. 199 (P–1351) May 13 1992 & JP-A-40 30 398 (Matsushita Electric Ind Co Ltd) Feb. 3, 1992 *abstract*.

Patent Abstracts of Japan, vo. 16, No. 423 (E–1260) Sep. 7, 1992 & JP-A-41 45 721 (NEC IC Microcomput Syst Ltd) May 19, 1992 *abstract*.

IBM Technical Disclosure Bulletin, vol. 25, No. 3A, Aug. 1982 pp. 1073–1074, G. D. Miller et al.: "Johnson Counter with Error Correction" *the whole document*.

*Primary Examiner*—Margaret Rose Wambach
*Attorney, Agent, or Firm*—Robert Groover; Betty Formby

[57] ABSTRACT

A decoded counter employing a shift register and a zero-detect circuit has the ability of returning to a correct state within a limited number of clock cycles if an invalid state is accidentally assumed by the counter. One of the flip-flops is provided with synchronous set while all the other flip-flops of the shift register are provided with synchronous reset. The output of the last flip-flop of the register drives a single set-reset line common to all the flip-flops and the pull-up line of the zero-detect circuit is connected to the input of the first flip-flop of the register. Optionally, one of the flip-flops may be provided with asynchronous set and the others with an asynchronous reset, for initializing the counter in a certain state through a single clear-load line.

35 Claims, 4 Drawing Sheets

```
N   U   QQQQQQQQQQQQQQQQQQQQQQ         1   0   0000000000000000001000
C   /   01234567891111111111222        1   0   0000000000000000010000
1   D             0123456789012        1   0   0000000000000000100000
                                       1   0   0000000000000001000000
x   x   xxxxxxxxxxxxxxxxxxxxxx         1   0   0010000000000010000000 <
0   x   1000000000000000000000         1   0   0100000000000100000000
0   x   1000000000000000000000         1   0   1000000000000000000000 >
1   1   0100000000000000000000         1   0   0000000000000000000001
1   1   0010000000000000000000         1   0   0000000000000000000010
1   1   0001000000000000000000         1   0   0000000000000000000100
1   1   0000100000000000000000         1   0   0000000000000000001000
1   1   0000010000000000000000         1   0   0000000000000000010000
1   1   0000101000000000000000 <       1   0   0000000000000000100000
1   1   0000110100000000000000         1   0   0000000000000001000000
1   1   0000011010000000000000         1   0   0000000000000010000000
1   1   0000001101000000000000         1   0   0000000000000100000000
1   1   0000000110100000000000         1   0   0000000000001000000000
1   1   0000000011010000000000         1   0   0000000000010000000000
1   1   0000000001101000000000         1   0   0000000000100000000000
1   1   0000000000110100000000         1   0   0000000001000000000000
1   1   0000000000011010000000         1   0   0000000010000000000000
1   1   0000000000001101000000         1   0   0000000100000000000000
1   1   0000000000000110100000         1   0   0000001000000000000000
1   1   0000000000000011010000         1   0   0000010000000000000000
1   1   0000000000000001101000         1   0   0000100000000000000000
1   1   0000000000000000110100         1   0   0001000000000000000000
1   1   0000000000000000011010         1   0   0010000000000000000000
1   1   0000000000000000001101         1   0   0100000000000000000000
1   1   1000000000000000000000 >       1   0   1000000000000000000000
1   1   0100000000000000000000         1   0   0000000000000000000001
1   1   0010000000000000000000         1   0   0000000000000000000010
1   1   0001000000000000000000         1   0   0000000000000000000100
1   1   0000000000000000000000 <       1   0   0000000000000000001000
1   1   1000000000000000000000 >       1   0   0000000000000000010000
1   1   0100000000000000000000         0   x   1000000000000000000000
1   1   0010000000000000000000
1   1   0001000000000000000000
1   1   0000100000000000000000
1   1   0000010000000000000000
1   1   0000001000000000000000
1   1   0000000100000000000000
1   1   0000000010000000000000
1   1   0000000001000000000000
1   1   0000000000100000000000
1   1   0000000000010000000000
1   1   0000000000001000000000
1   1   0000000000000100000000
1   1   0000000000000010000000
1   1   0000000000000001000000
1   1   0000000000000000100000
1   1   0000000000000000010000
1   1   0000000000000000001000
1   1   0000000000000000000100
```

FIG. 9

DECODED COUNTER WITH ERROR CHECK AND SELF-CORRECTION

CROSS-REFERENCE TO RELATED APPLICATION

This application claims priority from European application 93830264.3, filed Jun. 21, 1993, which is hereby incorporated by reference.

BACKGROUND AND SUMMARY OF THE INVENTION

The present invention relates to a decoded (ring) counter (e.g. based on a shift register) which is capable of self-correcting any invalid state that may accidentally be assumed by the counter.

The field of the application of shift registers (SR) is extremely wide and differentiated and includes also counters. In fact, if for example the output of the last edge-triggered, D, flip-flop (FF) of a shift register (SR) is connected to the input of the first flip-flop and if to a reset input of any one of the flip-flops is fed a logic "1", a so-called, "N-module" counter is implemented, where N is the number of flip-flops that form the shift register. A shift-register-based ring counter of this type is schematically shown in FIG. 1.

It is also well known that the above is not a widely used solution for realizing a counter because of several drawbacks, including:

i) Silicon area requirements. An N-module binary counter is normally implemented with a number of flip-flops equal to the integer portion of $\log_2(N)+1$ (if N is a multiple of 2, a number given by $\log_2(N)$ of flip-flops would be sufficient). By contrast an equivalent counter, made with a shift register, would require an N number of flip-flops.

ii) Power consumption. Because a ring counter requires a larger number of flip-flops, it will more heavily load the timing system (clock signal).

iii) Number of possible states. An N-module, binary counter has 2 k possible states (k is the minimum whole number such that 2 k be $\geq$N). Conversely, a ring counter has 2N possible states. In particular, if, because of a disturbance, a unique "1" is lost, or if a second "1" is introduced, the ring counter is no longer capable of "cleaning" itself and to return in a correct state.

Notwithstanding these intrinsic drawbacks and disadvantages, a ring counter may be, and is, advantageously used when extremely fast responses and symmetrical clock/output delays are required. In fact, if we have N signals that must cyclically become "high", one at the time, a solution could be that of using a binary counter followed by a K→N decoder, as depicted in FIG. 2. However, an alternative solution could be that of using an N-module ring counter like the one depicted in FIG. 1.

The latter solution requires a larger number of flip-flops, but in this case, the silicon area that would be required is not much different from the area that would be required by the first solution, as long as N is not too large. In fact, according to the first solution besides K flip-flops, it is necessary to implement a decoder, whose architecture is generally not modularly structured as the circuit of the second solution is. Moreover, the K→N decoder that is required in the case of a binary counter, will introduce delays and will be hard to correctly size so that the outputs will switch-on and off with the same switching times (in other words, symmetry of outputs is difficult to procure).

There is also another problem (which in certain applications assumes a fundamental importance): this is the necessity of ensuring that the outputs do not undergo spurious transitions, i.e. that an output signal should be free of spikes following the switching of other outputs.

Unless an appropriate counting code (e.g. the well known Grey code) is used, it is not easy to ensure that a decoder will be totally exempt from this problem. On the other hand, the use of counting codes which are different from the normal binary representation of numbers complicates the remaining circuitry of the counter.

By contrast, by using a ring counter instead, one could not exclude the possibility that (even though this might be improbable) the ring counter could assume an illegal (invalid) state, as mentioned at point iii) above.

In other words, a ring counter such as the one depicted in FIG. 1 may incur one of the following problems:

A) because of an accidental disturbance, more than a single flip-flop of the shift register may store a logic "1". In this case, the synchronous machine would evolve through a sequence of states that never includes a correct one (that is a single flip-flop storing a logic "1"), and therefore the machine would continue to count, but incorrectly;

B) because of an accidental disturbance, the only logic "1" that shifts through the flip-flop chain forming the shift register may be accidentally erased. In such a case, the synchronous machine would enter a stable state and, unless it is acted upon through a suitable reset signal, the counting process would stop.

In both cases, a ring counter may be thought of as becoming "dirty", and being unable to return to a "clear" condition.

The present invention, in a disclosed embodiment, avoids the first problem by using a set/reset mechanism, rather than the data loopback of the prior art, to provide feedback from the end of the chain to the beginning. The data output of the last stage in the chain drives a set/reset line which is connected to a set input of the first stage, and to reset inputs of all other stages. Thus when a "1" propagates through to the last stage, any other propagating "1" bits are extinguished. The second problem is solved by a wired-OR arrangement which is driven by an additional output of each stage, to detect a stable all-zeros state.

Thus the present invention, in a disclosed embodiment, provides a decoded counter employing a shift register and a zero-detect circuit in order to return to a correct state within a limited number of clock cycles whenever an invalid state is accidentally assumed by the counter. One of the flip-flops is provided with synchronous set while all the other flip-flops of the shift register are provided with synchronous reset. The output of the last flip-flop of the register drives a single set-reset line common to all the flip-flops and the pull-up line of the zero-detect circuit is connected to the input of the first flip-flop of the register. Optionally, one of the flip-flops may be provided with asynchronous set and the others with an asynchronous reset, for initializing the counter in a certain state through a single clear-load line.

According to a disclosed class of innovative embodiments, there is provided: A decoded counter circuit, comprising: a plurality of flip-flops chained together, with each intermediate one of the flip-flops having a data input which is connected to a data output of an immediately preceding stage, and a set/reset line which is operatively connected to all of the flip-flops, in a configuration which drives the respective data outputs of the first flip-flop in the chain into a first state when the set/reset line is in an active state, and which drives the respective data outputs of all other the flip-flops in the chain into a second state when the set/reset line is in an active state; the last flip-flop in the chain having the data output thereof connected to drive the set/reset line.

According to another disclosed class of innovative embodiments, there is provided: A decoded counter circuit, comprising: a plurality of data storage stages chained together, with each intermediate one of the stages having a clock input, a data input, and a data output which corresponds to the data input when the clock input receives a predetermined clock waveform portion, the data input thereof being connected to a data output of an immediately preceding stage, and a set/reset line which is operatively connected to all of the stages, in a configuration which drives the respective data outputs of the first stage in the chain into a first state when the set/reset line is in an active state, and which drives the respective data outputs of all other the stages in the chain into a second state when the set/reset line is in an active state; the last the stage in the chain having the data output thereof connected to drive the set/reset line.

According to another disclosed class of innovative embodiments, there is provided: A decoded counter circuit, comprising: a plurality of logic stages chained together, with each intermediate one of the stages having a data output which corresponds to a clocked version of a data input thereof, the data input being connected to the data output of an immediately preceding stage, and an additional output which is inactive whenever neither the data input nor the data output have the first state; and a set/reset line which is operatively connected to all of the stages, in a configuration which drives the respective data outputs of the first stage in the chain into a first state when the set/reset line is in an active state, and which drives the respective data outputs of all other the stages in the chain into a second state when the set/reset line is in an active state; the last stage in the chain having the data output thereof connected to drive the set/reset line; a wired-logic combining stage which is connected to receive the additional outputs of all of the stages, and which drives the set/reset line active if all of the additional outputs remain inactive.

According to another disclosed class of innovative embodiments, there is provided: A decoded counter circuit, comprising: a plurality of multiplexed-input-flip-flops chained together, with each intermediate one of the flip-flops having a first data input which is connected to a data output of an immediately preceding stage, and a second data input which is connected to a data output of an immediately succeeding stage, and a select input which selects between the first and second data inputs; an up/down line which is operatively connected to the select inputs of all of the flip-flops; a set/reset line which is operatively connected to all of the flip-flops, in a configuration which drives the respective data outputs of the first flip-flop in the chain into a first state when the set/reset line is in an active state, and which drives the respective data outputs of all other the flip-flops in the chain into a second state when the set/reset line is in an active state; the set/reset line being operatively connected to be driven by the data output of a first one of the flip-flops in the chain when the up/down line is in a first state, and by the data output of another one of the flip-flops in the chain when the up/down line is in a second state.

According to another disclosed class of innovative embodiments, there is provided: A decoded counter with self-correction capability, comprising: a shift register composed of an n flip-flops, one of which is provided with a synchronous set while all the others are provided with respective synchronous re-set inputs and wherein the output of the last flip-flop of the shift register drives a single set-reset line common to all the flip-flops; and a zero-detect circuit having a pull-up line functionally connected to an input of the first flip-flop of the register.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 9 shows the result of a simulated operation of the counter of FIG. 7.

DETAILED DESCRIPTION OF THE PREFERRED EMBODIMENTS

Figure 4:
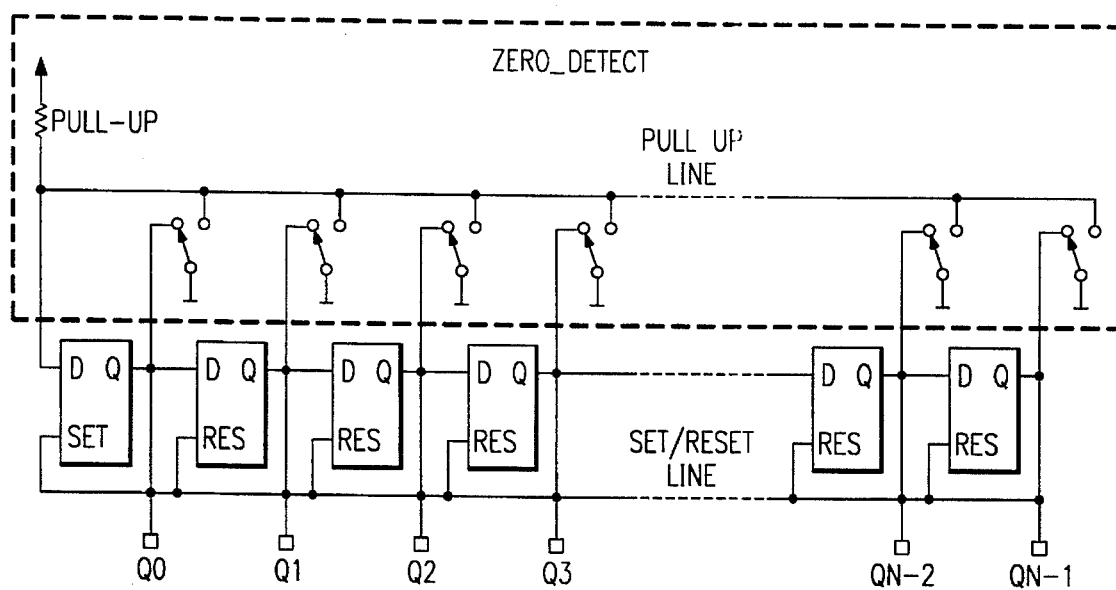
FIG. 4 is a functional diagram of an N-module, self-correcting, decoded counter made with a shift register, according to the present invention.

The numerous innovative teachings of the present application will be described with particular reference to the presently preferred embodiment (by way of example, and not of limitation), in which:

In the functional diagram of an innovative ring counter of the invention, in the sample embodiment shown in FIG. 4, all but one of the flip-flops are edge-triggered, D-type, with synchronous reset; the remaining one, for example the first of the chain, is provided instead with a synchronous set.

All but one of the flip-flops may be provided also with an asynchronous reset (clear) input, with the exception of e.g. the first of the chain, which may be provided also with an asynchronous set (load) input. The output of a flip-flop is assumed to go high when the signal applied to a set input is high.

Figure 1:
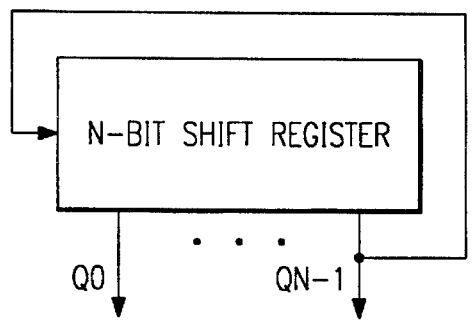
FIG. 1 is a schematic illustration of the structure of a ring counter made with a shift register, as already described above.
Figure 2:
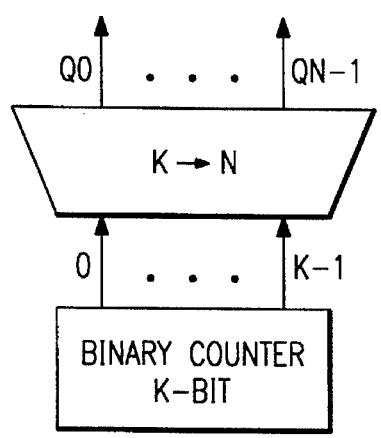
FIG. 2 is a schematic illustration of an equivalent binary counter provided with a decoder, as already described above.
Figure 3:
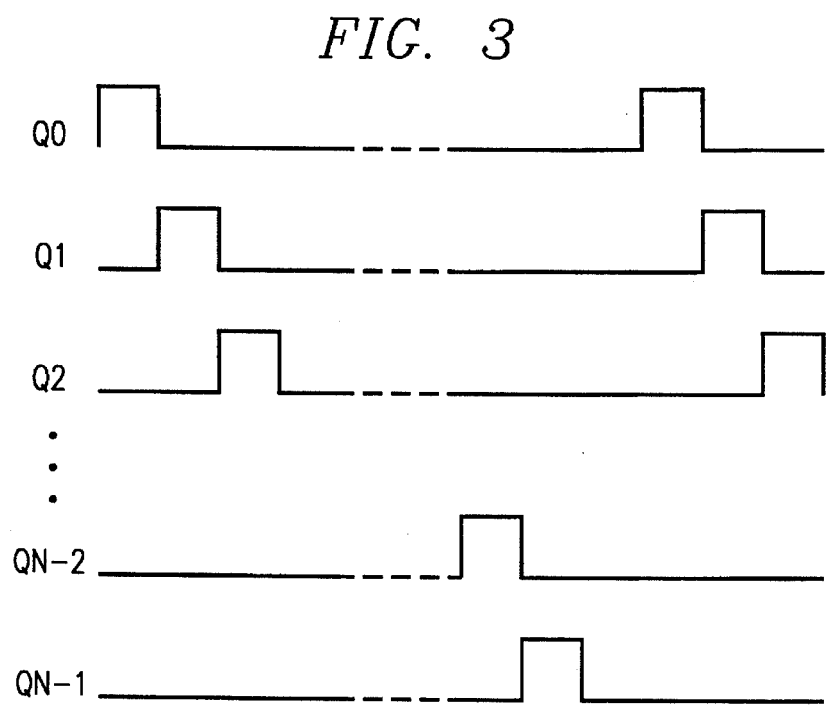
FIG. 3 shows the signals that may be obtained either with the ring counter of FIG. 1, or with the binary counter of FIG. 2.

In practice, no asynchronous set-reset (clear-load) circuitry is needed unless the counter is required to start from a predefined state (as will be described later). For clearer illustration, the clock line is not shown in FIGS. 1, 2 and 4. It should be understood that the clock signal is the same for all the flip-flops.

It may be assumed that at the switching-on instant or at any other given instant, a circuit (not shown in the figures) will introduce a single logic "1" in the chain of flip-flops. Such a circuitry could be functionally represented by a generator of a "clear" signal, acting through an asynchronous "set-reset" line simultaneously on all the flip-flops, thus resetting all of them, with the exception of the single flip-flop, mentioned above, which would be set instead. Alternatively, such a circuitry could be functionally represented by a circuit that would generate a signal forcing the synchronous set-reset line at a high logic value, so that, in the first flip-flops of the chain, a "1" will be loaded, while a "0" will be loaded in all the other flip-flops of the chain.

It should be remarked again that, as will be seen later, such an initialization is not intrinsically necessary for the operation of the ring counter of the invention.

The operating principle of the ring counter of the invention may be summarized as follows.

In absence of disturbances, there is a single "1" that circulates through the counter structure. When it arrives at the output of the last flip-flops of the chain, which, instead of being connected to the D input of the first flip-flop of the chain as it would be in a ring counter of a conventional type, is connected instead to a common set-reset line, this imposes the reset of all the flip-flops with the exception of the first flip-flop of the chain, which instead is forced (through its synchronous set terminal) to assume the value "1". Obviously, this takes place only at the subsequent active edge of the clock signal, because the set-reset inputs are synchronous. Moreover, the D input of the first flip-flop (the flip-flop provided with set) as will be shown later, is generally at a logic "zero". Therefore, under normal conditions the whole system evolves as in a normal cyclic shift register (SR) in which the output of the last flip-flop of the chain fed back to the input of the first flip-flop (functionally in a manner equivalent to the one schematically shown in FIG. 1).

SOLUTION TO THE ABOVE-IDENTIFIED PROBLEM A.

If more than one flip-flop contains a "1", then when the first of these "1" values reaches the last flip-flop of the chain it will automatically trigger the synchronous set-reset procedure mentioned above, and at that time all of the "1" values will be cancelled (except that the first flip-flop will be forced to "1" through its set input).

SOLUTION TO THE ABOVE-IDENTIFIED PROBLEM B.

If none of the flip-flops contain a "1", then all the switches driven by the respective flip-flops (at their outputs P_Dw) will be open, and therefore the pull-up line assumes a high logic level through its pull-up device. In this way, at a following active edge of the clock signal, the first flip-flop of the chain will load a "1" through its D input, and therefore a correct state of operation of the ring counter will be re-established. It should be observed that the ring counter of the present invention does not require any circuitry for initializing the counter (obviously if the starting condition is of no interest) because, in any event, after N-2 clock cycles at most, the counter assumes a correct operating state (i.e. at the Nth active edge of the clock signal, the ring counter will positively be in a correct state).

Figure 5:
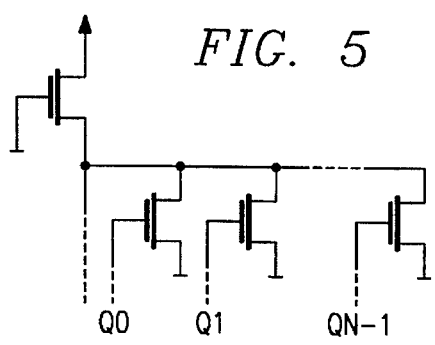
FIG. 5 is the diagram of a static-type, zero-detect circuit usable in the counter of FIG. 4.
Figure 6:
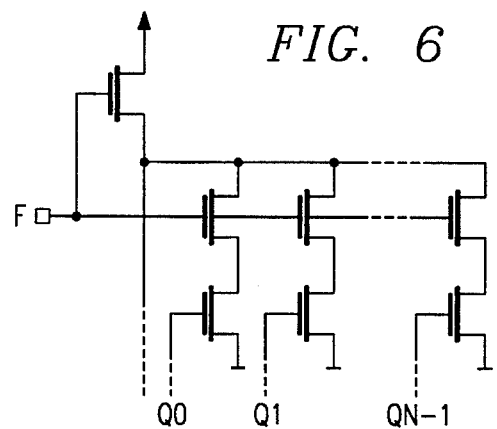
FIG. 6 is the diagram of a dynamic-type, zero-detect circuit usable in the counter of FIG. 4.

The zero-detect circuit schematically shown in FIG. 4 may be implemented in different ways. Two examples of alternative ways of realizing the zero-detect circuit are schematically shown in FIGS. 5 and 6. In FIG. 5, the functional diagram of a so-called static-type zero-detect circuit is shown. The operation of the circuit is evident and does not require any explanation.

The zero-detect circuit shown in FIG. 6 is of a so-called dynamic-type and employs a phase-control line (f), which allows a precharge of the pull-up line. This type of dynamic, zero-detect circuit may be used conveniently when the flip-flops that are employed for making the counter are of the Master-Slave type. During an interval of the clock period, the Master latch is in a storing state (i.e. is not in a "read" state), and therefore nothing will happen if its input changes state. During this interval of the cycle, the pull-up device (for example the p-MOS, driven by the phase signal f) precharges the pull-up line, which is momentarily decoupled from the switches functionally driven by the respective outputs $Q_i$ of the flip-flops that compose the counter, by a second plurality of switches (in the example shown n-MOS transistors) that are controlled by the phase signal f. In the depicted example, this happens for f=0.

When the Master latch passes to a reading phase (f=1), if one of the outputs Qi of one of the flip-flops that compose the counter is at "1", the respective transistor (switch) is ON (closed) and, through the relative n-MOS that in this phase is conducting, the pull-up line is discharged. In this way a logic "0" is fed to the input D of the first flip-flop of the chain. When a dynamic zero-detect circuit such as the one shown in FIG. 6 is used, particular care must be exercised when designing the circuit in order to avoid charge redistribution phenomena.

Of course, from the point of view of circuit design, the solution represented by a static-type zero-detect circuit is simpler, although slower in operation. In particular, the pull-up device (a p-MOS in the example shown) is preferably a transistor having a relatively long channel.

On the other hand, if the system is not required to recognize the absence of a "1" within a single clock cycle, the use of a static-type, zero-detect circuit will not significantly limit the clock frequency.

Figure 7:
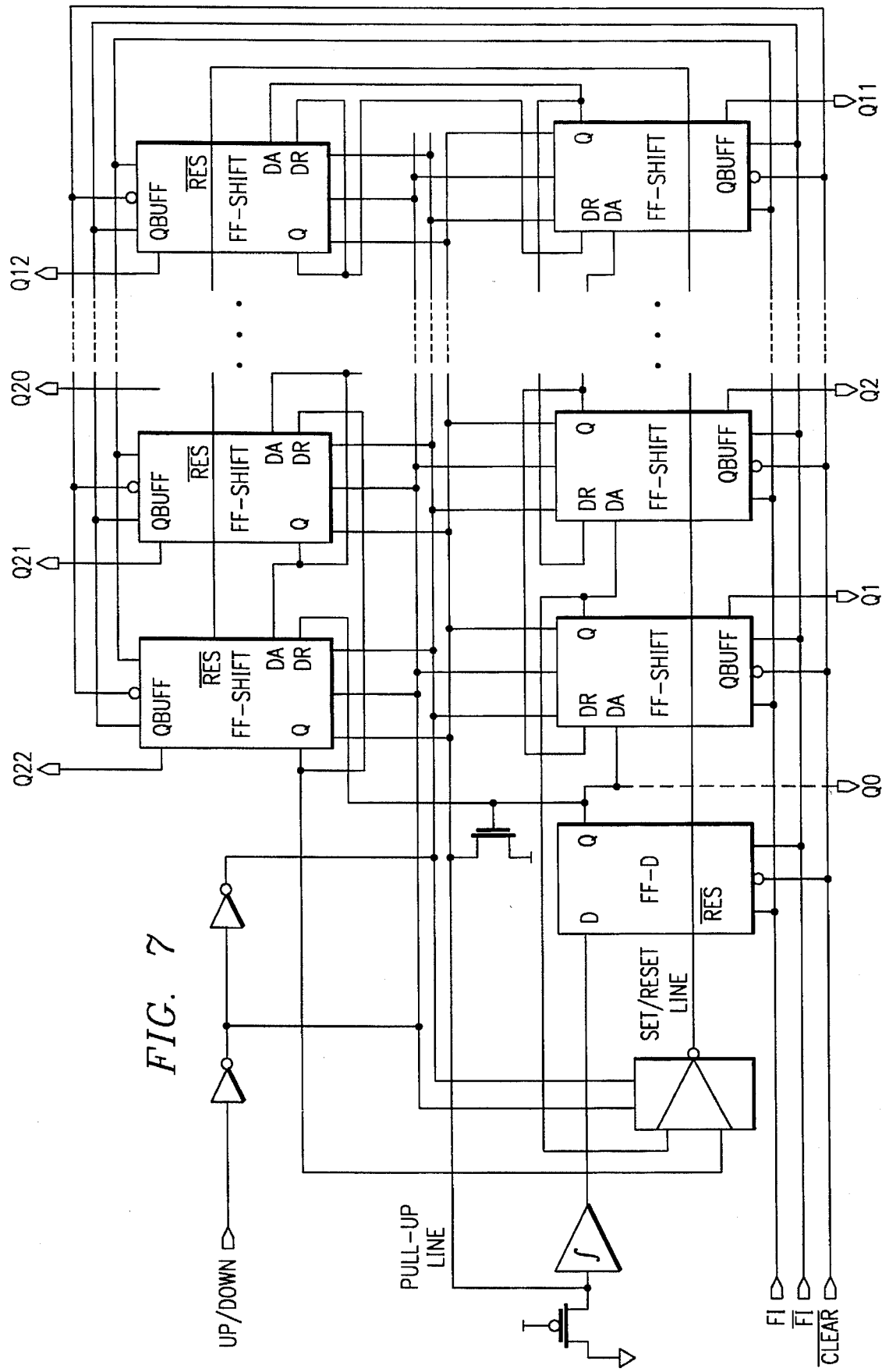
FIG. 7 shows a complete circuit diagram of a 23-module, Up-Down, self-correcting, decoded counter made according to the present invention.

A 23 module, Up-Down, self-correcting, decoded counter of the invention is depicted in FIG. 7. (In this Figure the intermediate stages 3–10 and 13–19 have been omitted for clarity, but their configuration and connections are the same as the remaining stages 2–21.) The operation of the ring counter shown in FIG. 7 is similar to the one described for the ring counter of FIG. 4, with the difference that the ith flip-flop receives the data on its D input from the (ith–1) flip-flop, or from the (ith+1) flip-flop, depending upon the value present on the Up-Down select pin. As a consequence, the set-reset line is driven either by the 23rd flip-flop or by the second flip-flop of the chain, depending on the up-down polarity.

Two clock phases (fi and fil) are directly applied to each flip-flop stage (FF-D or FF_shift). The clock signal is generated by an appropriate driver (not depicted in the figure) that may be specifically designed for ensuring symmetry of the output transitions.

The synchronous set-reset signal is generated by an appropriate buffer (contained within the multiplexer structure shown in the figure to the left of stage FF-D). This signal is connected to a synchronous-set input of stage FF-D, and to a synchronous-reset input of all the stages FF_shift.

The counter is capable of reversing the direction of counting through a command that may be applied through a dedicated pin Up-Down. Note that the corresponding line selects between the two data inputs to each of the FF_shift stages, and also selects whether the set/reset line will be driven by the output of stage 22 or stage 1. Each FF_shift stage has a DA input connected to the Q output of the preceding FF_shift stage, and has a DR input connected to the Q output of the following FF_shift stage; except that the first FF_shift stage (stage 1) has its DA input connected to the Q output of the FF-D stage (stage 0), and the last FF_shift stage has a DR input connected to the Q output of the FF-D stage (stage 0). Similarly, the added multiplexer selects which stage's Q output will drive the set/reset line.

Each stage is provided with an output buffer, to provide the required drive and pulse shape on the output lines.

The zero-detection circuit is connected to drive the data input D of the FF-D stage.

Moreover, the counter, in the presently preferred embodiment, is also provided with an asynchronous initialization pin (Clearl), which, when it goes low, resets in an asynchronous mode all the flip-flops with the exception of the first (stage 0) which, on the contrary, is forced (Load 1) to store a "1". All the flip-flops are static, as is the zero-detect network. The relatively slow signal on the pull-up line is regenerated by the use of a Schmitt trigger.

Figure 8:
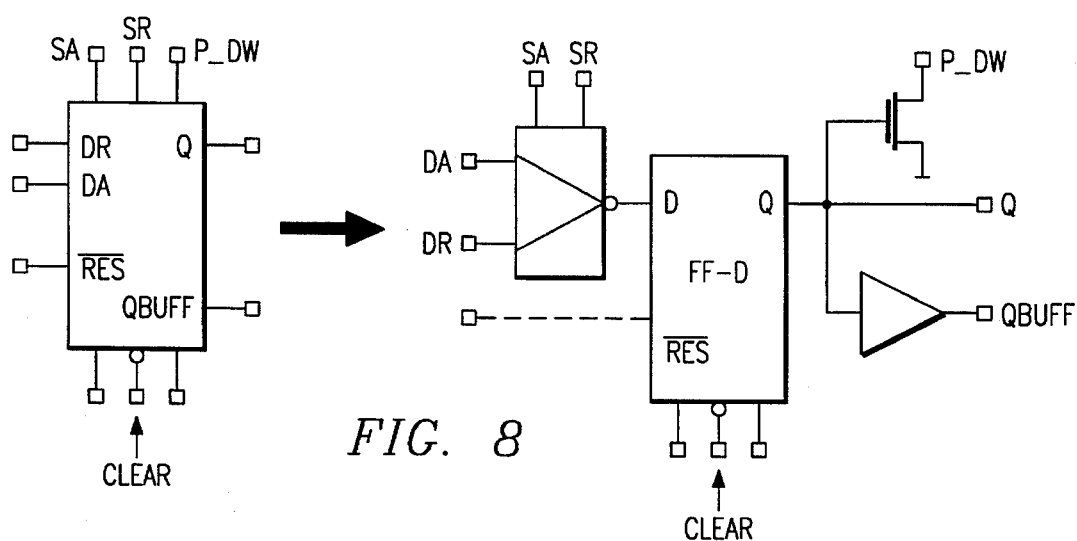
FIG. 8 shows the equivalent functional diagram of a FF-shift block used for making the counter of FIG. 7.

FIG. 8 shows the equivalent block diagram of a single FF_shift stage used in all but one of the stages of the counter of FIG. 7. Note that the data input DA or DR is selected by the selection line SA or SR respectively.

FIG. 9 is a table representing the result of a simulated operation of the 23 module, up-down, ring counter of FIG. 7.

It should be noted that a comparable ring counter of the prior art (FIG. 1a), without any self-correcting capability, would have occupied a silicon area practically identical to the area occupied by the ring counter of the invention. In practice, between a ring without any state control and a self-correcting ring counter of the present invention, there is a difference of only three "minimum-size" MOS transistors for each flip-flop. In general, the difference in the number of transistors will depend on the architecture of the flip-flops used.

The disclosed ring counter is particularly advantageous in applications where transition noise on unselected lines must be avoided. For example, this is particularly advantageous in an inkjet printer head driver, to avoid activation of more than one line at a time. This circuit can also be used advantageously in applications such as high-speed PLAs, high-speed multiplexing in video conversion, front ends to a fiber optic data link, or various comparable applications.

The innovative disclosed ideas are not limited to the specific disclosed embodiments, but can be implemented in a wide variety of other embodiments as well. For one example, the flip-flop stages could be replaced by other stage configurations. (For example, logic with complementary outputs could be used, or multi-bit stage configurations could be used instead, or an "interleaved" architecture could be used with a multi-phase clock.)

For another example, for the zero-detect circuit, it is not strictly necessary to have an output from every stage to the wired-NOR detector, IF the time constant of the wired-NOR detector stage is sufficiently long.

For another example, the innovative set+reset feedback (instead of the data loopback of the prior ring counter structures) could also (alternatively and less preferably) be used WITHOUT the zero-detection function. (In such embodiments the zero-detection function would be handled by other circuit implementations instead, e.g. by a "watchdog"-type circuit).

For another example, the use of asynchronous as well as synchronous set/reset inputs is also optional, as mentioned above. Moreover, in an alternative and less preferable class of embodiments, some of the advantages of the presently preferred embodiment can still be realized by feeding back the last stage's output to asynchronous rather than synchronous set/reset inputs. This would produce a phase shift every time recirculation of the counter occurred, but in some applications this might be tolerable.

For another example, the characteristics of the buffers which produce the buffered outputs Qbuf can be adjusted not only for the required loading, but also for the degree of overlap (or non-overlap) required.

What is claimed is:

1. A decoded counter, comprising:
   a plurality of flip-flops chained together, with each intermediate one of said flip-flops having a data input which is connected to a data output of an immediately preceding one of said flip-flops, and
   a set/reset line which is operatively connected to all of said flip-flops, in a configuration which drives the respective data outputs of the first flip-flop in said chain into a first state when said set/reset line is in an active state, and which drives the respective data outputs of all other said flip-flops in said chain into a second state when said set/reset line is in an active state;
   the last said flip-flop in said chain having said data output thereof connected to drive said set/reset line.

2. The counter of claim 1, comprising more than 16 of said flip-flops.

3. The counter of claim 1, wherein multiple ones of said flip-flops each include an additional output which is inactive whenever neither said data input nor said data output have a first state; and further comprising a wired-logic combining stage which is connected to receive said additional outputs of all of said flip-flops, and which drives said set/reset line active if all of said additional outputs remain inactive.

4. The counter of claim 1, wherein said flip-flops each include plural inputs, and multiplex selection logic connected to select among said plural inputs.

5. The counter of claim 1, wherein said set/reset line is connected to a respective synchronous reset input of all but one of said flip-flops.

6. The counter of claim 1, wherein said flip-flops also each include a respective asynchronous set/reset input.

7. The counter of claim 1, wherein said flip-flops each also include an additional data input, and multiplex selection logic connected to select between said data input and said additional data input, and wherein each intermediate one of said flip-flops has said additional data input thereof connected to a data output of an immediately succeeding one of said flip-flops.

8. A decoded counter, comprising:
   a plurality of data storage stages chained together, with each intermediate one of said stages having a clock input, a data input, and a data output which corresponds to said data input when said clock input receives a predetermined clock waveform portion, said data input thereof being connected to a data output of an immediately preceding stage, and
   a set/reset line which is operatively connected to all of said stages, in a configuration which drives the respective data outputs of the first stage in said chain into a first state when said set/reset line is in an active state, and which drives the respective data outputs of all other said stages in said chain into a second state when said set/reset line is in an active state;

the last said stage in said chain having said data output thereof connected to drive said set/reset line.

9. The counter of claim 8, comprising more than 16 of said stages.

10. The counter of claim 8, wherein multiple ones of said stages each include an additional output which is inactive whenever neither said data input nor said data output have a first state; and further comprising a wired-logic combining stage which is connected to receive said additional outputs of all of said stages, and which drives said set/reset line active if all of said additional outputs remain inactive.

11. The counter of claim 8, wherein each said stage comprises a D-type flip-flop.

12. The counter of claim 8, wherein said stages each include plural inputs, and multiplex selection logic connected to select among said plural inputs.

13. The counter of claim 8, wherein said stages each also include an additional data input, and multiplex selection logic connected to select between said data input and said additional data input, and wherein each intermediate one of said stages has said additional data input thereof connected to a data output of an immediately succeeding stage.

14. The counter of claim 8, wherein said set/reset line is connected to a respective synchronous reset input of all but one of said stages.

15. The counter of claim 8, wherein said stages also each include a respective asynchronous set/reset input.

16. A decoded counter, comprising:

a plurality of logic stages chained together, with each intermediate one of said stages having a data output which corresponds to a clocked version of a data input thereof, said data input being connected to said data output of an immediately preceding stage, and an additional output which is inactive whenever neither said data input nor said data output have said first state; and a set/reset line which is operatively connected to all of said stages, in a configuration which drives the respective data outputs of the first stage in said chain into a first state when said set/reset line is in an active state, and which drives the respective data outputs of all other said stages in said chain into a second state when said set/reset line is in an active state;

the last said stage in said chain having said data output thereof connected to drive said set/reset line;

a wired-logic combining stage which is connected to receive said additional outputs of all of said stages, and which drives said set/reset line active if all of said additional outputs remain inactive.

17. The counter of claim 16, comprising more than 16 of said stages.

18. The counter of claim 16, wherein each said stage comprises a D-type flip-flop.

19. The counter of claim 16, wherein each said stage comprises a D-type flip-flop, and wherein said set/reset line is connected to a respective synchronous reset input of all but one of said stages.

20. The counter of claim 16, wherein each said stage comprises a D-type flip-flop, and wherein said stages also each include a respective asynchronous set/reset input.

21. The counter of claim 16, wherein said stages each include plural inputs, and multiplex selection logic connected to select among said plural inputs.

22. The counter of claim 16, wherein said stages each also include an additional data input, and multiplex selection logic connected to select between said data input and said additional data input, and wherein each intermediate one of said stages has said additional data input thereof connected to a data output of an immediately succeeding stage.

23. A decoded counter, comprising:

a plurality of multiplexed-input-flip-flops chained together, with each intermediate one of said flip-flops having a first data input which is connected to a data output of an immediately preceding one of said flip-flops, and a second data input which is connected to a data output of an immediately succeeding one of said flip-flops, and a select input which selects between said first and second data inputs;

an up/down line which is operatively connected to said select inputs of all of said flip-flops;

a set/reset line which is operatively connected to all of said flip-flops, in a configuration which drives the respective data outputs of the first flip-flop in said chain into a first state when said set/reset line is in an active state, and which drives the respective data outputs of all other said flip-flops in said chain into a second state when said set/reset line is in an active state;

said set/reset line being operatively connected to be driven by said data output of a first one of said flip-flops in said chain when said up/down line is in a first state, and by said data output of another one of said flip-flops in said chain when said up/down line is in a second state.

24. The counter of claim 23, comprising more than 16 of said flip-flops.

25. The counter of claim 23, wherein said set/reset line is connected to a respective synchronous reset input of all but one of said flip-flops.

26. The counter of claim 23, wherein said flip-flops also each have a respective asynchronous set or reset input.

27. The counter of claim 23, wherein multiple ones of said flip-flops each include an additional output which is inactive whenever neither said data input nor said data output have a first state; and further comprising a wired-logic combining stage which is connected to receive said additional outputs of all of said flip-flops, and which drives said set/reset line active if all of said additional outputs remain inactive.

28. The counter of claim 23, wherein said flip-flops each include plural inputs, and multiplex selection logic connected to select among said plural inputs.

29. A decoded counter with self-correction capability, comprising:

a shift register composed of an n flip-flops, one of which is provided with a synchronous set while all the others are provided with respective synchronous re-set inputs and wherein the output of the last flip-flop of the shift register drives a single set-reset line common to all the flip-flops; and a zero-detect circuit having a pull-up line functionally connected to an input of the first flip-flop of the register.

30. A decoded counter as defined in claim 29, wherein one of said flip-flops composing the shift register is provided with asynchronous load means while all the others are provided with asynchronous clear means.

31. A decoded counter according to claim 30, having a common clear-load line driven by initialization means.

32. A decoded counter as defined in claim 29, wherein said zero-detect circuit is an n-input NOR gate.

33. A decoded counter as defined in claim 29, wherein said pull-up line is shared by all the flip-flops.

34. A decoded counter as defined in claim 32, wherein said zero-detect circuit is of a static-type, to each flip-flop being associated a switch driven by the signal present at an output of the respective flip-flop and functionally connected between said pull-up line and a ground node said pull-up line being connected to a supply node through a pull-up device.

35. A decoded counter according to claim 32, wherein said zero-detect circuit is of a dynamic-type and comprises a phase-control line for precharging said pull-up line; said pull-up line being decoupled from first switches driven by said flip-flops by second switches, functionally connected in series to said first switches and controlled through said phase-control line in common with a pull-up device.

* * * * *